US009905561B2

(12) United States Patent
Kim et al.

(10) Patent No.: US 9,905,561 B2
(45) Date of Patent: *Feb. 27, 2018

(54) INTEGRATED CIRCUIT AND SEMICONDUCTOR DEVICE

(71) Applicant: Samsung Electronics Co., Ltd., Suwon-si, Gyeonggi-do (KR)

(72) Inventors: Ha-young Kim, Seoul (KR); Sung-we Cho, Hwaseong-si (KR); Tae-joong Song, Seongnam-si (KR); Sang-hoon Baek, Seoul (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/409,523

(22) Filed: Jan. 18, 2017

(65) Prior Publication Data

US 2017/0133380 A1    May 11, 2017

Related U.S. Application Data

(63) Continuation of application No. 15/093,504, filed on Apr. 7, 2016, now Pat. No. 9,583,493.

(30) Foreign Application Priority Data

Apr. 8, 2015  (KR) .................. 10-2015-0049953
Sep. 10, 2015  (KR) .................. 10-2015-0128566

(51) Int. Cl.
*H01L 23/52* (2006.01)
*H01L 27/092* (2006.01)
(Continued)

(52) U.S. Cl.
CPC ...... *H01L 27/0924* (2013.01); *G06F 17/5077* (2013.01); *H01L 23/528* (2013.01);
(Continued)

(58) Field of Classification Search
CPC ............ H01L 27/0924; H01L 23/5226; H01L 23/528; H01L 23/5286; H01L 27/0207
See application file for complete search history.

(56) References Cited

U.S. PATENT DOCUMENTS 5,220,187 A   6/1993 Miyaoka et al.
5,994,726 A   11/1999 Ikeda et al.
(Continued)

FOREIGN PATENT DOCUMENTS

JP       2997479 B2    10/1999
JP       2001068549 A   3/2001
JP       2007073885 A   3/2007

*Primary Examiner* — Nicholas Tobergte
(74) *Attorney, Agent, or Firm* — Renaissance IP Law Group LLP

(57) ABSTRACT

An embodiment includes an integrated circuit comprising a standard cell, the standard cell comprising: first and second active regions having different conductivity types and extending in a first direction; first, second, and third conductive lines extending over the first and second active regions in a second direction substantially perpendicular to the first direction, and disposed parallel to each other; and a cutting layer extending in the first direction between the first and second active regions and separating the first conductive line into a first upper conductive line and a first lower conductive line, the second conductive line into a second upper conductive line and a second lower conductive line, and the third conductive line into a third upper conductive line and a third lower conductive line; wherein: the first upper conductive line and the third lower conductive line are electrically connected together; and the second upper conductive line and the second lower conductive line are electrically connected together.

20 Claims, 14 Drawing Sheets

(51) Int. Cl.
  *H01L 23/522*   (2006.01)
  *H01L 23/528*   (2006.01)
  *H01L 27/02*    (2006.01)
  *G06F 17/50*    (2006.01)

(52) U.S. Cl.
  CPC ...... *H01L 23/5226* (2013.01); *H01L 23/5286* (2013.01); *H01L 27/0207* (2013.01)

(56) References Cited

U.S. PATENT DOCUMENTS

| | | | |
|---|---|---|---|
| 6,084,255 A | 7/2000 | Ueda et al. | |
| 7,137,094 B2 | 11/2006 | Tien | |
| 7,679,106 B2 | 3/2010 | Hamada | |
| 7,852,655 B2* | 12/2010 | Tanaka | H01L 27/0203 356/154 |
| 8,258,547 B2 | 9/2012 | Becker et al. | |
| 8,258,550 B2 | 9/2012 | Becker et al. | |
| 8,258,552 B2 | 9/2012 | Becker et al. | |
| 8,264,049 B2 | 9/2012 | Becker | |
| 8,455,354 B2 | 6/2013 | Chen et al. | |
| 8,610,176 B2 | 12/2013 | Patel et al. | |
| 8,669,596 B2 | 3/2014 | Tamaru | |
| 8,836,040 B2 | 9/2014 | Kamal et al. | |
| 8,921,896 B2 | 12/2014 | Becker et al. | |
| 9,431,383 B2 | 8/2016 | Baek et al. | |
| 2009/0278142 A1* | 11/2009 | Watanabe | H01L 21/6835 257/89 |
| 2013/0032885 A1 | 2/2013 | Swamynathan et al. | |
| 2014/0097493 A1 | 4/2014 | Baek et al. | |
| 2014/0159195 A1 | 6/2014 | Chen | |
| 2014/0339647 A1 | 11/2014 | Rashed et al. | |
| 2015/0035070 A1 | 2/2015 | Chiang et al. | |
| 2015/0048424 A1 | 2/2015 | Tien et al. | |
| 2016/0027769 A1 | 1/2016 | Baek et al. | |

* cited by examiner

INTEGRATED CIRCUIT AND SEMICONDUCTOR DEVICE

CROSS-REFERENCE TO RELATED APPLICATION

This application is a continuation of U.S. patent application Ser. No. 15/093,504, filed on Apr. 7, 2016, which claims the benefit of Korean Patent Application No. 10-2015-0049953, filed on Apr. 8, 2015, in the Korean Intellectual Property Office, and Korean Patent Application No. 10-2015-0128566, filed on Sep. 10, 2015, in the Korean Intellectual Property Office, the disclosure of which is incorporated herein in its entirety by reference.

BACKGROUND

Embodiments relate to an integrated circuit, and more particularly, to an integrated circuit including a standard cell, and a semiconductor device including to the integrated circuit.

Designing of a semiconductor integrated circuit is an operation of converting a behavior model regarding a chip describing an operation to be obtained from a semiconductor system into a detailed structural model describing connections between components. When a library with cells that are in the semiconductor integrated circuit is generated and the semiconductor integrated circuit is realized by using the library while designing such a semiconductor integrated circuit, time and costs consumed in designing and realizing the semiconductor integrated circuit may be reduced.

SUMMARY

An embodiment includes an integrated circuit comprising a standard cell, the standard cell comprising: first and second active regions having different conductivity types and extending in a first direction; first, second, and third conductive lines extending over the first and second active regions in a second direction substantially perpendicular to the first direction, and disposed parallel to each other; and a cutting layer extending in the first direction between the first and second active regions and separating the first conductive line into a first upper conductive line and a first lower conductive line, the second conductive line into a second upper conductive line and a second lower conductive line, and the third conductive line into a third upper conductive line and a third lower conductive line; wherein: the first upper conductive line and the third lower conductive line are electrically connected together; and the second upper conductive line and the second lower conductive line are electrically connected together.

An embodiment includes a semiconductor device comprising: a substrate comprising first and second active regions that have different conductivity types and extend in a first direction; first, second, and third upper gate electrodes extending in a second direction substantially perpendicular to the first direction and disposed parallel to each other, on the first active region; and first, second, and third lower gate electrodes respectively disposed on the second active region inline with the first, second, and third upper gate electrodes, respectively, and separated from the first, second, and third upper gate electrodes, respectively; wherein: the first upper gate electrode and the third lower gate electrode are electrically connected together; and the second upper gate electrode and the second lower gate electrode are electrically connected together.

An embodiment includes a semiconductor device comprising: first through fourth gate electrodes, wherein: the first and second gate electrodes are adjacent in a first direction; the third and fourth gate electrodes are adjacent in the first direction; the second and third gate electrodes are adjacent and extend inline in a second direction substantially perpendicular to the first direction; a first metal layer extending in the first direction; and a second metal layer extending in the second direction; wherein: the first and fourth gate electrodes are electrically connected together through the first metal layer; and the second and third gate electrodes are electrically connected together through the second metal layer.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Figure 1:
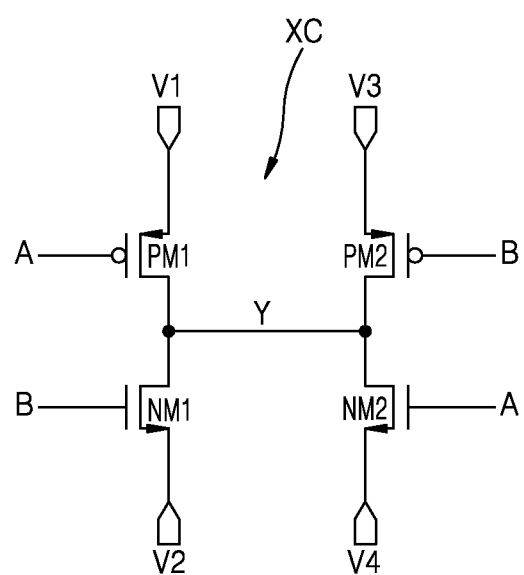
FIG. 1 is a circuit diagram of a cross-coupled structure according to an embodiment.

Hereinafter, embodiments will be described in detail with reference to the accompanying drawings. Embodiments are provided so that this disclosure will be thorough and complete, and will fully convey the concept to one of ordinary skill in the art. Since embodiments may take many different forms, particular embodiments are illustrated in the drawings and are described in the detailed description. However, this does not limit the embodiments to these particular embodiments and it should be understood that the embodiments include all the modifications, equivalents, and replacements within the idea and technical scope. Like reference numerals refer to like elements throughout. In the drawings, the dimensions and size of each structure are exaggerated, reduced, or schematically illustrated for convenience in description and clarity.

The terms used in this application to describe a particular embodiment are not intended to limit all embodiments. In the following description, the technical terms are used only to explain a specific embodiment while not limiting other embodiments. The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components.

Terms like a first and a second may be used to describe various elements, but the elements should not be limited by the terms. The terms may be used only as object for distinguishing an element from another element. For example, without departing from the spirit and scope, a first element may be referred to as a second element, and similarly, the second element may be referred to as the first element.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

An integrated circuit may be defined by multiple cells, and in detail, may be designed by using a cell library including characteristic information of the cells. Here, a name of a cell, a dimension, a gate width, a pin, delay characteristic, a leakage current, a threshold voltage, a function, and/or the like may be defined in the cell library. A cell library set may include basic cells such as an AND gate, an OR gate, a NOR gate, an inverter, etc., complex cells such as an OR/AND/INVERTER (OAI) gate, an AND/OR/INVERTER (AOI) gate, etc., and storage elements such as a master-slave flip-flop, a latch, etc.

In embodiments to be described below, a cell may be a standard cell, and a cell library may be a standard cell library cell. A standard cell method may be a method where multiple standard cells having various functions are prepared, and a dedicated large scale integration (LSI) according to a specification of a customer or a user is designed by combining the standard cells. The standard cell may be previously designed and verified, and then may be registered in a computer. A logic design, which is obtained by combining multiple standard cells with a computer aided design (CAD) tool, placement, and routing, may be made.

In detail, in a case of designing/manufacturing an LSI, when multiple standardized logic circuit blocks (or cells) are already stored in a library, a logic circuit block suitable for the purpose of a current design may be selected from among the standardized logic circuit blocks and may be placed in multiple cell rows on a chip, and optimal routing where a routing length is shortest may be made in a routing space between cells, thereby manufacturing a whole circuit. If many kinds of cells are stored in the library, an adaptability of a design is increased, and thus, a possibility of an optimal design of a chip is increased.

As used herein, the term "and/or" includes any and all combinations of one or more of the associated listed items. Expressions such as "at least one of" when preceding a list of elements, modify the entire list of elements and do not modify the individual elements of the list.

The term "substantially" may be used to describe a relationship between components, elements, degrees, or the like. Substantially includes the precise relationship and similar relationships available with manufacturing processes. For example, a first structure that is substantially perpendicular to a second structure may not be precisely perpendicular, but is substantially perpendicular if it is perpendicular within manufacturing tolerances.

FIG. 1 is a circuit diagram of a cross-coupled structure XC according to an embodiment. Referring to FIG. 1, the cross-coupled structure XC may include a first PMOS transistor PM1 and a first NMOS transistor NM1, which are connected in series, and a second PMOS transistor PM2 and a second NMOS transistor NM2, which are connected in series. The cross-coupled structure XC according to this embodiment may be included in any one of various standard cells, for example, a latch, sequential cells such as a flip-flop, and combinational cells such as a multiplexer or an adder.

In detail, the first PMOS transistor PM1 may include a source connected to a first voltage terminal V1, a gate to receive a first control signal A, and a drain connected to an output node Y. The first NMOS transistor NM1 may include a drain connected to the output node Y, a gate to receive a second control signal B, and a source connected to a second voltage terminal V2. The second PMOS transistor PM2 may include a source connected to a third voltage terminal V3, a gate to receive the second control signal B, and a drain connected to the output node Y. The second NMOS transistor NM2 may include a drain connected to the output node Y, a gate to receive the first control signal A, and a source connected to a fourth voltage terminal V4.

According to this embodiment, the gates of the first PMOS transistor PM1 and the second NMOS transistor NM2 may be electrically connected to each other to receive the first control signal A. Also, the gates of the first NMOS transistor NM1 and the second PMOS transistor PM2 may be electrically connected to each other to receive the second control signal B. Accordingly, the first and second PMOS transistors PM1 and PM2 and the first and second NMOS transistors NM1 and NM2 may form the cross-coupled structure XC.

Figure 2:
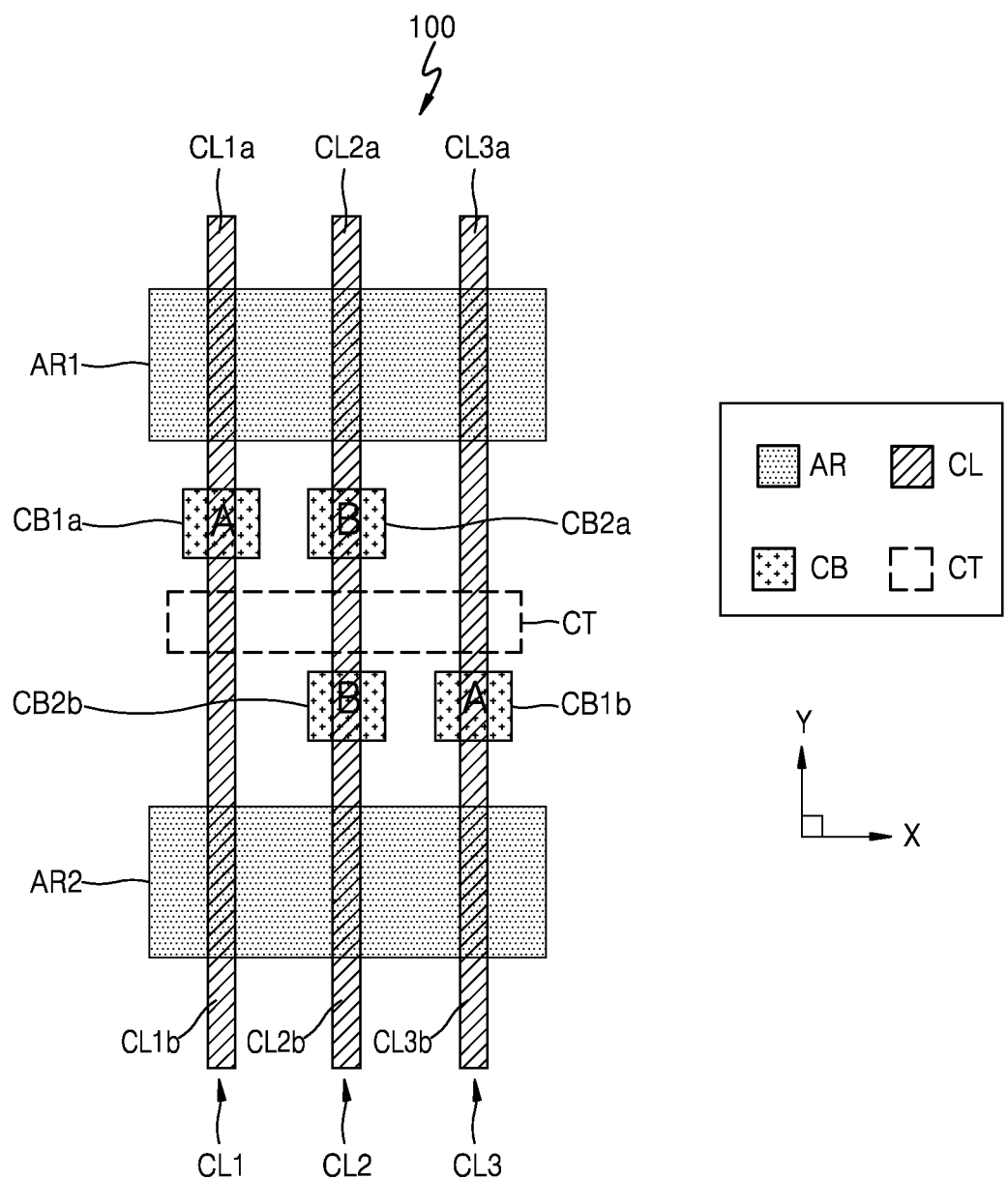
FIGS. 2 through 5 are layouts of parts of standard cells having cross-coupled structures, according to some embodiments.

FIG. 2 is a layout of a part of a standard cell 100 having a cross-coupled structure, according to an embodiment. Referring to FIG. 2, the standard cell 100 may include first and second active regions AR1 and AR2, first through third conductive lines CL1 through CL3, multiple contacts CB, and a cutting layer CT. The standard cell 100 according to this embodiment may have the cross-coupled structure XC of FIG. 1. For convenience of description, only a part of the standard cell 100 is shown in FIG. 2, and thus the standard cell 100 may be designed to further include other components.

The first and second active regions AR1 and AR2 extend along a first direction (for example, an X direction), and may be parallel to each other in a second direction (for example, a Y direction) substantially perpendicular to the first direction. In this embodiment, the first and second active regions AR1 and AR2 may be spaced apart from each other in the second direction. A region between the first and second active regions AR1 and AR2 may be referred to as a dummy region (for example, a dummy region DR of FIG. 5). As used herein, when a region, layer, portion, or the like extends in a particular direction, a major axis of the corresponding structure is disposed along the direction.

The first through third conductive lines CL1 through CL3 may extend along the second direction over the first and second active regions AR1 and AR2, and may be parallel to each other in the first direction. Here, the first through third conductive lines CL1 through CL3 may include an electrically conductive material, and for example, may include polysilicon, a metal, a metal alloy, or a combination of such materials. According to an embodiment, the first through third conductive lines CL1 through CL3 may correspond to gate electrodes or gate structures. However, other embodiments are not limited thereto, and each of the first through third conductive lines CL1 through CL3 may be a trace configured for a different function.

The cutting layer CT may extend in the first direction between the first and second active regions AR1 and AR2 to cross the first through third conductive lines CL1 through CL3. Here, the cutting layer CT may be a marking layer for cutting some regions of the first through third conductive lines CL1 through CL3. Accordingly, the first through third conductive lines CL1 through CL3 may each be separated into two regions.

In a semiconductor device manufactured according to the layout including the cutting layer CT, the first conductive line CL1 may be separated into a first upper conductive line CL1a on the first active region AR1 and a first lower conductive line CL1b on the second active region AR2, and accordingly, the first upper conductive line CL1a and the first lower conductive line CL1b may be electrically insulated from each other. Also, the second conductive line CL2 may be separated into a second upper conductive line CL2a on the first active region AR1 and a second lower conductive line CL2b on the second active region AR2, and accordingly, the second upper conductive line CL2a and the second lower conductive line CL2b may be electrically insulated from each other. Also, the third conductive line CL3 may be separated into a third upper conductive line CL3a on the first active region AR1 and a third lower conductive line CL3b on the second active region AR2, and accordingly, the third upper conductive line CL3a and the third lower conductive line CL3b may be electrically insulated from each other.

As the development of semiconductor process technology focuses on smaller structures, a size of a standard cell may be further reduced, and when the standard cell has high density, a length of the standard cell in the second direction may be further reduced, and thus an interval between conductive lines that are insulated from each other needs to be reduced. A layout of a standard cell that does not include the cutting layer CT includes an upper conductive line on the first active region AR1 and a lower conductive line on the second active region AR2, and a sufficient interval needs to be created between the upper conductive line and the lower conductive line.

In contrast, a layout of a standard cell that includes the cutting layer CT includes a single conductive line crossing the first and second active regions AR1 and AR2, and further includes a cutting layer that separates the single conductive line between the first and second active regions AR1 and AR2. Accordingly, the single conductive line may be separated into an upper conductive line and a lower conductive line, and an interval between the upper and lower conductive lines may be much smaller than that of the layout of the standard cell that does not include the cutting layer CT.

According to recent further development of the semiconductor process technology, an overall design rule of a semiconductor device has been further reduced. Specifically, due to restrictions in the design rule regarding the cutting layer CT, it may be difficult to individually and selectively separate multiple conductive lines. In detail, due to the restrictions in the design rule regarding the cutting layer CT, it may be difficult to dispose the cutting layer CT only on one of the conductive lines that are adjacently disposed to each other. According to this embodiment, the cutting layer CT may extend in the first direction across the first through third conductive lines CL1 through CL3. Accordingly, the cutting layer CT may cut the first through third conductive lines CL1 through CL3 at once.

The contacts CB may be disposed on some regions of the first through third conductive lines CL1 through CL3 between the first and second active regions AR1 and AR2. Here, the contacts CB may be referred to as gate contacts, gate contact patterns, or gate contact plugs. In detail, a first upper contact CB1a may be disposed on the first upper conductive line CL1a, a first lower contact CB1b may be disposed on the third lower conductive line CL3b, a second upper contact CB2a may be disposed on the second upper conductive line CL2a, and a second lower contact CB2b may be disposed on the second lower conductive line CL2b.

The first control signal A may be applied through the first upper contact CB1a, and transmitted to the first upper conductive line CL1a. Also, the first control signal A may be applied through the first lower contact CB1b and transmitted to the third lower conductive line CL3b. In addition, the second control signal B may be applied through the second upper contact CB2a, and transmitted to the second upper conductive line CL2a. Also, the second control signal B may be applied through the second lower contact CB2b, and transmitted to the second lower conductive line CL2b.

As such, according to this embodiment, since the first control signal A is applied to the first upper conductive line CL1a and the third lower conductive line CL3b, which are separated from each other, the first upper conductive line CL1a and the third lower conductive line CL3b may be electrically connected to each other. Also, since the second control signal B is applied to the second upper conductive line CL2a and the second lower conductive line CL2b, which are separated from each other, the second upper conductive line CL2a and the second lower conductive line CL2b may be electrically connected to each other. Examples of this connection will now be described with reference to FIGS. 3 and 4.

Figure 3:
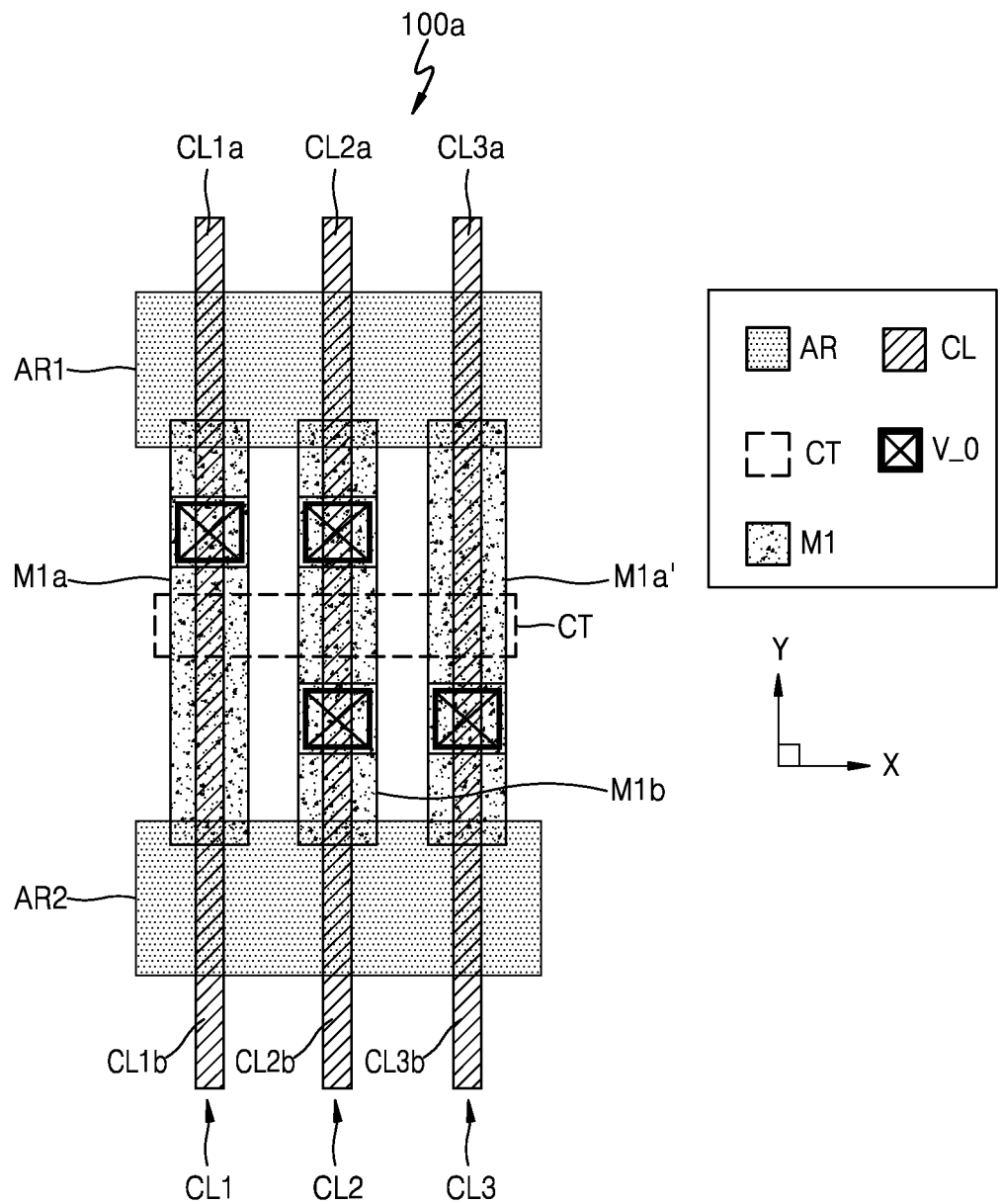

FIG. 3 is a layout of a part of a standard cell 100a having a cross-coupled structure, according to an embodiment. Referring to FIG. 3, the standard cell 100a may include the first and second active regions AR1 and AR2, the first through third conductive lines CL1 through CL3, the contacts CB, the cutting layer CT, first vias V_0, and first metal lines M1. The standard cell 100a according to this embodiment is a modified example of the standard cell 100 of FIG. 2, and thus details about the standard cell 100a, which have been described above with reference to FIG. 2, are not provided again. Hereinafter, differences between the standard cell 100a according to this embodiment and the standard cell 100 of FIG. 2 will be mainly described.

The first vias V_0 may be disposed on the first upper contact CB1a, the first lower contact CB1b, the second upper contact CB2a, and the second lower contact CB2b. The first vias V_0 may include an electrically conductive material. Here, the first vias V_0 may have dimensions substantially similar to those of the first upper contact CB1a, the first lower contact CB1b, the second upper contact CB2a, and the second lower contact CB2b. However, in other embodiments, the dimensions may be different.

A first metal line M1a may be connected to the first via V_0 on the first upper contact CB1a at an upper portion of the first conductive line CL1. The first metal line M1a may transmit the first control signal A, when applied, to the first upper conductive line CL1a through the first via V_0 and the first upper contact CB1a. According to this embodiment, the first metal line M1a may extend in the second direction at an upper portion of at least a portion of the first conductive line CL1. However, embodiments are not limited thereto, and the first metal line M1a may be designed in an arbitrary shape such that at least a portion of the first metal line M1a extends in the second direction. According to an embodiment, the first metal line M1a may have a shape in which at least one of two ends extends in the first direction. Although the first metal line M1a is illustrated as being disposed over the first lower conductive line CL1b, in other embodiments, the first metal line M1a does not extend over the first lower conductive line CL1b.

A first metal line M1a' may be connected to the first via V_0 on the first lower contact CB1b at an upper portion of the third conductive line CL3. The first metal line M1a' may transmit the first control signal A, when applied, to the third lower conductive line CL3b through the first via V_0 and the first lower contact CB1b. According to this embodiment, the first metal line M1a' may extend in the second direction at an upper portion of at least a portion of the third conductive line CL3. However, other embodiments are not limited thereto, and the first metal line M1a' may be designed in an arbitrary shape such that at least a portion of the first metal line M1a' extends in the second direction. According to an embodiment, the first metal line M1a' may have a shape in which at least one of two ends extends in the first direction. Although the first metal line M1a' is illustrated as being disposed over the third upper conductive line CL3a, in other embodiments, the first metal line M1a' does not extend over the third upper conductive line CL3a.

A first metal line M1b may be commonly connected to the first via V_0 on the second upper contact CB2a and the first via V_0 on the second lower contact CB2b, at an upper portion of the second conductive line CL2. The first metal line M1b may transmit the second control signal B, when applied, to the second upper conductive line CL2a through the first via V_0 and the second upper contact CB2a, and to the second lower conductive line CL2b through the first via V_0 and the second lower contact CB2b. According to this embodiment, the first metal line M1b may extend in the second direction at an upper portion of at least a portion of the second conductive line CL2. However, other embodiments are not limited thereto, and the first metal line M1b may be designed in an arbitrary shape such that at least a portion of the first metal line M1b extends in the second direction. According to an embodiment, the first metal line M1b may have a shape in which at least one of two ends extends in the first direction.

Figure 4:
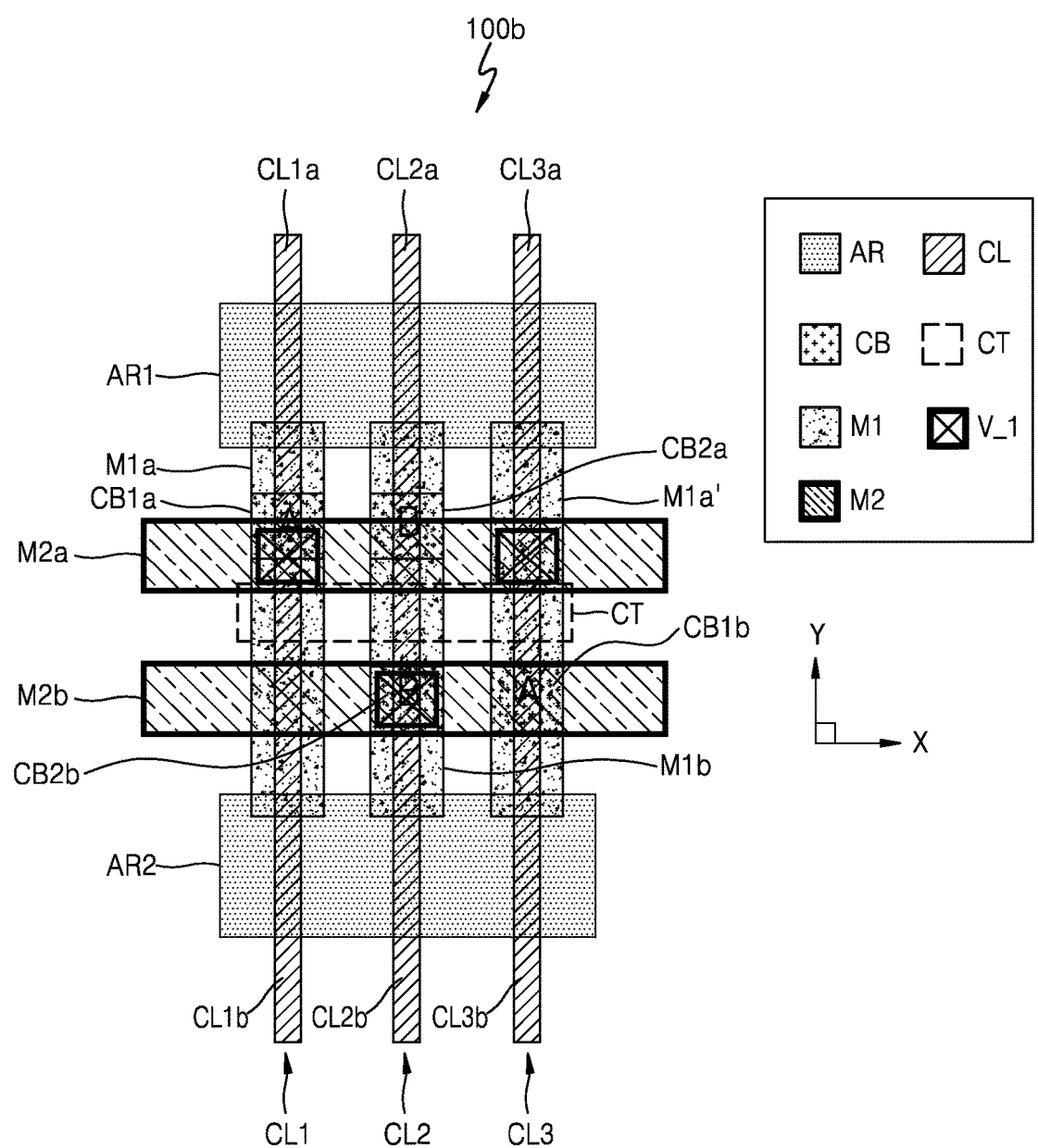

FIG. 4 is a layout of a part of a standard cell 100b having a cross-coupled structure, according to an embodiment. Referring to FIG. 4, the standard cell 100b may include the first and second active regions AR1 and AR2, the first through third conductive lines CL1 through CL3, the contacts CB, the cutting layer CT, the first vias V_0, the first metal lines M1, second vias V_1, and the second metal lines M2. The standard cell 100b according to this embodiment is a modified example of the standard cell 100a of FIG. 3, and thus details about the standard cell 100b, which have been described above with reference to FIGS. 2 and 3, are not provided again. Hereinafter, differences between the standard cell 100b according to this embodiment and the standard cell 100a of FIG. 3 will be mainly described.

The second vias V_1 may be disposed on the first metal lines M1a, M1a', and M1b. The second vias V_1 may include an electrically conductive material. Here, the second vias V_1 may have dimensions substantially similar to the first vias V_0. However, in other embodiments, the dimensions may be different.

A second metal line M2a may be commonly connected to the second via V_1 on the first metal line M1a and the second via V_1 on the first metal line M1a' at upper portions of the first metal lines M1a and M1a'. The second metal line M2a may provide the first control signal A, when applied, to the first upper conductive line CL1a through the second via V_1, the first metal line M1a, the first via V_0, and the first upper contact CB1a. Also, the second metal line M2a may provide the first control signal A, when applied, to the third lower conductive line CL3b through the second via V_1, the first metal line M1a', the first via V_0, and the first lower contact CB1b.

According to this embodiment, the second metal line M2a may extend in the first direction to cross the first metal lines M1a, M2a', and M1b. However, other embodiments are not limited thereto, and the second metal line M2a may be designed in an arbitrary shape such that at least a portion of the second metal line M2a extends in the first direction. According to an embodiment, at least one of two ends of the second metal line M2a may extend in the second direction.

A second metal line M2b may be connected to the second via V_1 on the first metal line M1b at an upper portion of the first metal line M1b. The second metal line M2b may provide the second control signal B, when applied, to the second upper conductive line CL2a through the second via V_1, the first metal line M1b, the first via V_0, and the second upper contact CB2a. Also, the second metal line M2b may provide the second control signal B, when applied, to the second lower conductive line CL2b through the second via V_1, the first metal line M1b, the first via V_0, and the second lower contact CB2b.

According to this embodiment, the second metal line M2b may extend in the first direction to cross the first metal lines M1a, M1a', and M1b. However, other embodiments are not limited thereto, and the second metal line M2b may be designed in an arbitrary shape such that at least a portion of the second metal line M2b extends in the first direction. According to an embodiment, at least one of two ends of the second metal line M2b may extend in the second direction. In this embodiment, the second metal lines M2a and M2b are disposed parallel to each other, but other embodiment are not limited thereto.

As described above with reference to FIGS. 2 through 4, according to various embodiments, the standard cells 100, 100a, and 100b include the cutting layer CT that extends in the first direction to separate the first through third conductive lines CL1 through CL3, and thus the first through third upper conductive lines CL1a through CL3a on the first active region AR1 and the first through third lower conductive lines CL1b through CL3b on the second active region AR2 may be electrically separated from each other.

According to some embodiments, the second upper conductive line CL2a and the second lower conductive line CL2b, which were separated from each other, may be electrically connected by using the first metal line M1b commonly connected to the second upper contact CB2a and the second lower contact CB2b. Also, the second control signal B may be commonly provided to the second upper conductive line CL2a and the second lower conductive line CL2b by using the second via V_1 on the second metal line M2b.

Also, according to some embodiments, the first upper conductive line CL1a and the third lower conductive line CL3b, which were separated from each other, may be electrically connected by using the second metal line M2a commonly connected to the first metal line M1a on the first upper contact CB1a and to the first metal line M1a' on the first lower contact CB1b. Here, the first control signal A may be commonly provided to the first upper conductive line CL1a and the third lower conductive line CL3b by using the second metal line M2a.

Accordingly, a cross-coupled structure according to some embodiments may be realized in a region corresponding to three conductive lines, i.e., the first through third conductive lines CL1 through CL3. In other words, the cross-coupled structure according to the current embodiments may be designed in a region corresponding to 3 grids. Here, a grid may correspond to a region according to the number of conductive lines, and may also be referred to as a contacted poly pitch (CPP). Accordingly, the cross-coupled structure according to the current embodiments may be referred to as a 3CPP cross-coupled structure. Although embodiments with three conductive lines CL1 through CL3 have been used as examples, in other embodiments, more conductive lines, such as four or more, may be present and each of these conductive lines may be cut by a cutting layer CT extending across the conductive lines.

Figure 5:
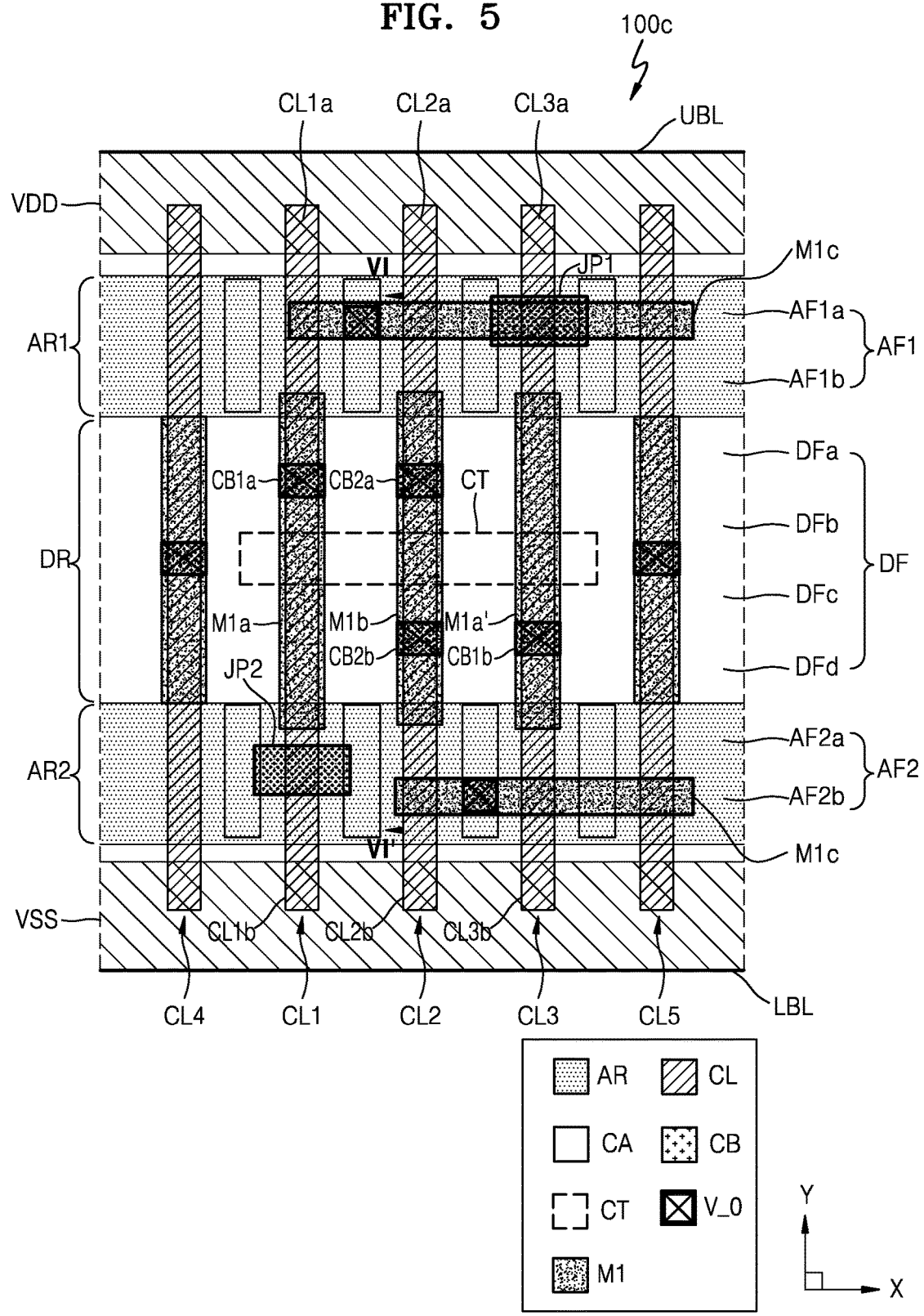

FIG. 5 is a layout of a part of a standard cell 100c having a cross-coupled structure, according to an embodiment. Referring to FIG. 5, the standard cell 100c may include the first and second active regions AR1 and AR2, first and second active fins AF1 and AF2, dummy fins DF, conductive lines CL, source/drain contacts CA, gate contacts CB1a, CB1b, CB2a and CB2b, and the cutting layer CT. Also, the standard cell 100c may further include the first vias V_0 and the first metal lines M1. Although not shown in FIG. 5, the standard cell 100c may further include the second vias V_1 of FIG. 4 and second metal lines M2.

The standard cell 100c may be defined by an upper boundary line UBL and a lower boundary line LBL, and may further include different circuits at right and left sides. The standard cell 100c according to this embodiment is a detailed implementation similar to those of the standard cells 100, 100a, and 100b of FIGS. 2 through 4, and details described above with reference to FIGS. 2 through 4 may be applied to this embodiment.

The first and second active regions AR1 and AR2 extend along the first direction and may be parallel to each other in the second direction. In this embodiment, the first and second active regions AR1 and AR2 may have different conductivity types. The first and second active regions AR1 and AR2 may be referred to as diffusion regions. According to an embodiment, the first active region AR1 may correspond to an N-type well and the second active region AR2 may correspond to a P-type well. According to an embodiment, a substrate may be a P-type substrate and may be used as the second active region AR2.

According to an embodiment, PMOS transistors, such as the first and second PMOS transistors PM1 and PM2 of FIG. 1, may be formed in the first active region AR1, and accordingly, the first active region AR1 may be referred to as a PMOS defining region. According to an embodiment, NMOS transistors, such as the first and second NMOS transistors NM1 and NM2 of FIG. 1, may be formed in the second active region AR2, and accordingly, the second active region AR2 may be referred to as an NMOS defining region.

The first and second active fins AF1 and AF2, and the dummy fins DF extend along the first direction, and may be parallel to each other. According to an embodiment, the first and second active fins AF1 and AF2, and the dummy fins DF may be spaced apart from each other at regular intervals. The first active fins AF1 may be disposed in the first active region AR1, and may form, for example, PMOS transistors, such as the first and second PMOS transistors PM1 and PM2 of FIG. 1. Also, the second active fins AF2 may be disposed in the second active region AR2, and may form, for example, NMOS transistors, such as the first and second NMOS transistors NM1 and NM2 of FIG. 1. Here, the numbers of first and second active fins AF1 and AF2 and dummy fins DF included in the standard cell 100c may vary according to embodiments.

The conductive lines CL may extend along the second direction over the first and second active regions AR1 and AR2, and may be parallel to each other in the first direction. According to an embodiment, the conductive lines CL may be spaced apart from each other at regular intervals. Here, the number of conductive lines CL included in the standard cell 100c may vary according to embodiments. In this embodiment, the conductive lines CL may correspond to gate electrodes.

The cutting layer CT may extend in the first direction in the dummy region DR between the first active region AR1 and the second active region AR2 to cross the first through third conductive lines CL1 through CL3. Accordingly, the first conductive line CL1 may be separated into the first upper conductive line CL1a on the first active region AR1 and the first lower conductive line CL1b on the second active region AR2. Also, the second conductive line CL2 may be separated into the second upper conductive line CL2a on the first active region AR1 and the second lower conductive line CL2b on the second active region AR2. Also, the third conductive line CL3 may be separated into the third upper conductive line CL3a on the first active region AR1 and the third lower conductive line CL3b on the second active region AR2.

The source/drain contacts CA may extend along the second direction and be disposed on the first and second active regions AR1 and AR2. Each of the source/drain contacts CA may be disposed between the two adjacent conductive lines CL. Here, the source/drain contacts CA may be referred to as source/drain contact patterns or source/drain contact plugs.

The gate contacts CB1a, CB1b, CB2a and CB2b may be disposed on some regions of the conductive lines CL corresponding to the dummy region DR. Here, the gate contacts CB1a, CB1b, CB2a and CB2b may be referred to as gate contact patterns or gate contact plugs. In detail, the first upper contact CB1a may be disposed on the first upper conductive line CL1a, the first lower contact CB1b may be disposed on the third lower conductive line CL3b, the second upper contact CB2a may be disposed on the second upper conductive line CL2a, and the second lower contact CB2b may be disposed on the second lower conductive line CL2b.

According to an embodiment, the first and second upper contacts CB1a and CB2a may be spaced apart from the lower boundary line LBL by substantially the same distance. In other words, the first and second upper contacts CB1a and CB2a may be disposed at corresponding locations along a line extending in the first direction. According to an embodiment, the first and second lower contacts CB1b and CB2b may be spaced apart from the lower boundary line LBL by substantially the same distance. In other words, the first and second lower contacts CB1b and CB2b may be disposed at corresponding locations along a line extending in the first direction. However, other embodiments are not limited thereto, and the locations of the first and second upper contacts CB1a and CB2a and the first and second lower contacts CB1b and CB2b may vary.

The first via V_0 corresponding to the output node Y may be formed on the source/drain contact CA disposed between the first upper conductive line CL1a and the second upper conductive line CL2a in the first active region AR1. The first via V_0 corresponding to the output node Y may be formed on the source/drain contact CA disposed between the second lower conductive line CL2b and the third lower conductive line CL3b in the second active region AR2. The output node Y on the first active region AR1 and the output node Y on the second active region AR2 may be electrically connected to each other through a metal layer M1c disposed at an upper portion of the first and second active regions AR1 and AR2.

The first via V_0 configured to receive the first control signal A may be formed on the first upper contact CB1a and the first lower contact CB1b. The first via V_0 configured to receive the second control signal B may be formed on the second upper contact CB2a and the second lower contact CB2b. Here, the first via V_0 may have the substantially similar dimension as the corresponding contact.

The first metal line M1a may be connected to the first via V_0 on the first upper contact CB1a at an upper portion of the first conductive line CL1. The first metal line M1a may transmit the first control signal A, when applied, to the first upper conductive line CL1a through the first via V_0 and the first upper contact CB1a. In this embodiment, the first metal line M1a may extend in the second direction at an upper portion of a portion of the first conductive line CL1. However, other embodiments are not limited thereto, and the first metal line M1a may be designed in an arbitrary shape such that at least a portion of the first metal line M1a extends in the second direction. According to an embodiment, at least one of two ends of the first metal line M1a may extend in the first direction.

The first metal line M1a' may be connected to the first via V_0 on the first lower contact CB1b at a lower portion of the third conductive line CL3. The first metal line M1a' may transmit the first control signal A, when applied, to the third lower conductive line CL3b through the first via V_0 and the first lower contact CB1b. In this embodiment, the first metal line M1a' may extend in the second direction at an upper portion of a portion of the third conductive line CL3. However, other embodiments are not limited thereto, and the first metal line M1a' may be designed in an arbitrary shape such that at least a portion of the first metal line M1a' extends in the second direction. According to an embodiment, at least one of two ends of the first metal line M1a' may extend in the first direction.

The first metal line M1b may be commonly connected to the first via V_0 on the second upper contact CB2a and the first via V_0 on the second lower contact CB2b, at an upper portion of the second conductive line CL2. The first metal line M1b may transmit the second control signal B, when applied, to the second upper conductive line CL2a through the first via V_0 and the second upper contact CB2a, and transmit the second control signal B, when applied, to the second lower conductive line CL2b through the first via V_0 and the second lower contact CB2b. In this embodiment, the first metal line M1b may extend in the second direction at an upper portion of a portion of the second conductive line CL2. However, other embodiments are not limited thereto, and the first metal line M1b may be designed in an arbitrary shape such that at least a portion of the first metal line M1b extends in the second direction. According to an embodiment, at least one of two ends of the first metal line M1b may extend in the first direction.

In some embodiments, a first jumper JP1 may be disposed at upper portions of the third upper conductive line CL3a and the source/drain contacts CA at two sides of the third upper conductive line CL3a. Accordingly, the first jumper JP1 is electrically connected to the third upper conductive line CL3a and the source/drain contacts CA at the two sides of the third upper conductive line CL3a to form one node.

Also, the first jumper JP1 may extend in the first direction, and thus may be disposed in a direction crossing the third upper conductive line CL3a and the source/drain contacts CA at the two sides of the third upper conductive line CL3a.

Also, a second jumper JP2 may be disposed at upper portions of the first lower conductive line CL1b and the source/drain contacts CA at two sides of the first lower conductive line CL1b. Accordingly, the second jumper JP2 is electrically connected to the first lower conductive line CL1b and the source/drain contacts CA at the two sides of the first lower conductive line CL1b to form one node. Also, the second jumper JP2 may extend in the first direction, and thus may be disposed in a direction crossing the first lower conductive line CL1b and the source/drain contacts CA at the two sides of the first lower conductive line CL1b.

Accordingly, even when the third upper conductive line CL3a and the first lower conductive line CL1b are realized in a semiconductor device manufactured according to the standard cell 100c, the third upper conductive line CL3a and the first lower conductive line CL1b may substantially have a skipped or screened structure. Accordingly, the first and second jumpers may each be referred to as a skip device. Here, a jumper is a conducting wire having a relatively short length for connecting two arbitrary points or two arbitrary terminals in an integrated circuit. The first and second jumpers JP1 and JP2 may include an electrically conductive material, and may include, for example, polysilicon, a metal, or a metal alloy.

Although not shown in FIG. 5, in some embodiments, the third upper conductive line CL3a and the source/drain contacts CA at the two sides of the third upper conductive line CL3a may be electrically connected to each other by using a first metal line. Accordingly, the third upper conductive line CL3a and the source/drain contacts CA at the two sides of the third upper conductive line CL3a may be electrically connected to each other to form one node. However, other embodiments are not limited thereto, and the third upper conductive line CL3a and the source/drain contacts CA at the two sides of the third upper conductive line CL3a may be electrically connected to each other by using another upper metal line or a wire.

Also, the first lower conductive line CL1b and the source/drain contacts CA at two sides of the first lower conductive line CL1b may be electrically connected to each other by using a first metal line. Accordingly, the first lower conductive line CL1b and the source/drain contacts CA at the two sides of the first lower conductive line CL1b may be electrically connected to each other to form one node. However, other embodiments are not limited thereto, and the first lower conductive line CL1b and the source/drain contacts CA at the two sides of the first lower conductive line CL1b may be electrically connected to each other by using another upper metal line or a wire.

In some embodiments, the cutting layer CT may not extend over adjacent conductive lines. For example, fourth and fifth conductive lines CL4 and CL5 may be adjacent to the first and third conductive lines CL1 and CL3, respectively. In particular, in some embodiments, the first through third conductive lines CL1 through CL3 maybe the only similarly situated conductive lines between the fourth and fifth conductive lines CL4 and CL5. However, the cutting layer CT does not extend to cut the fourth and fifth conductive lines CL4 and CL5.

Figure 6:
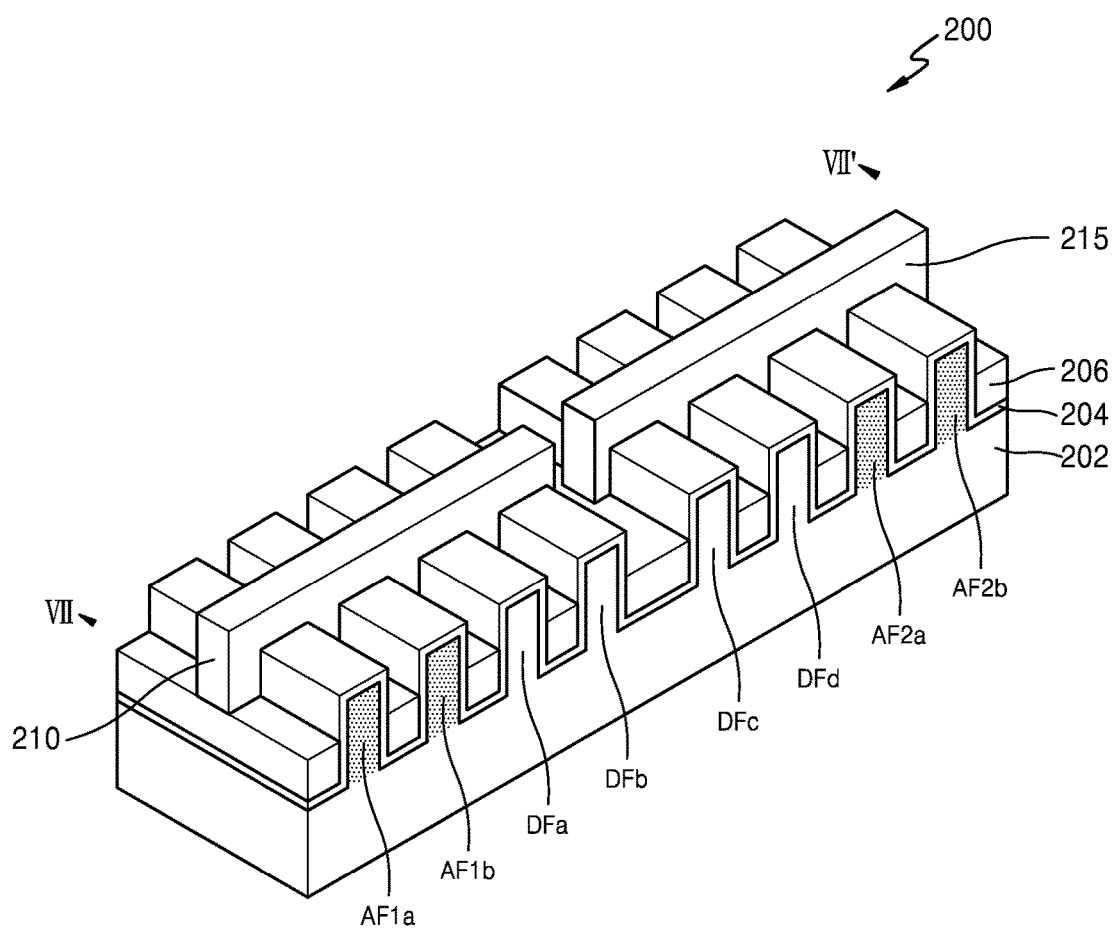
FIG. 6 is a perspective view of a semiconductor device according to an embodiment.
Figure 7:
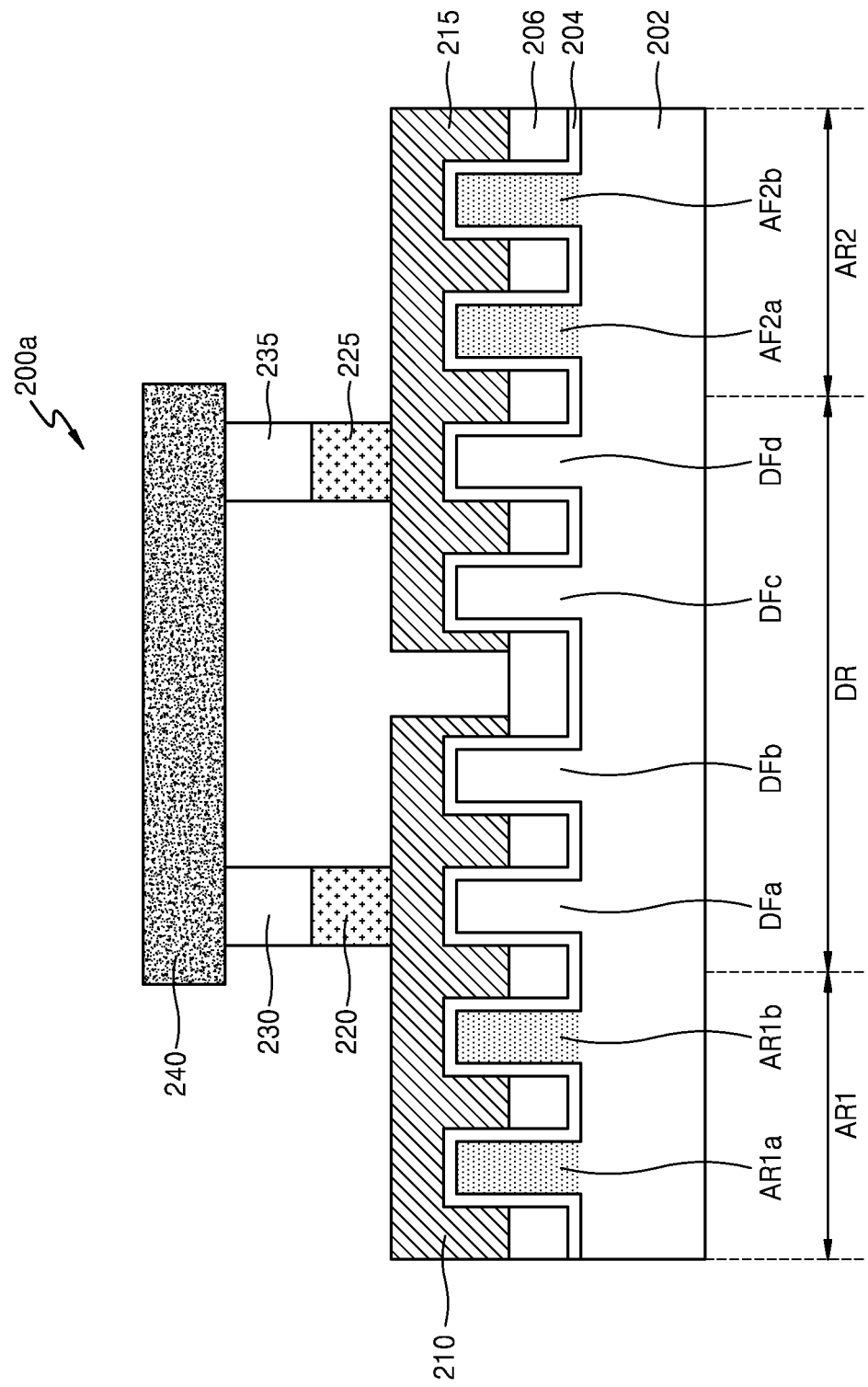
FIG. 7 is a cross-sectional view taken along a line VII-VII' of FIG. 6.

FIG. 6 is a perspective view of a semiconductor device 200 according to an embodiment. FIG. 7 is a cross-sectional view 200a taken along a line VII-VII' of FIG. 6.

Referring to FIGS. 6 and 7, the semiconductor device 200 may include a substrate 202, a first insulating layer 204, a second insulating layer 206, first active fins AF1a and AF1b, second active fins AF2a and AF2b, dummy fins DFa through DFd, and first and second gate electrodes 210 and 215. According to an embodiment, the semiconductor device 200 may be an example of a semiconductor device having the layout of FIG. 5. According to this embodiment, the semiconductor device 200 may be a bulk-type fin transistor. However, other embodiments are not limited thereto, and according to an embodiment, the semiconductor device 200 may be a silicon-on-insulator (SOI)-type fin transistor.

The substrate 202 may be a semiconductor substrate, and for example, the semiconductor substrate may include any one of silicon, SIO, silicon-on-sapphire, germanium, silicon-germanium, gallium-arsenide, or the like.

The first active fins AF1 and AF1b, the second active fins AF2a and AF2b, and the dummy fins DFa through DFd may be connected to the substrate 202. According to an embodiment, the first and second active fins AF1a, AF1b, AF2a, and AF2b may be active regions obtained by n+ or p+ doping perpendicularly protruding regions of the substrate 202, and the dummy fins DFa through DFd may be perpendicularly protruding regions of the substrate 202, which are not doped.

The first insulating layer 204 may include an insulating material, and for example, the insulating material may include any one of an oxide film, a nitride film, or an oxynitride film. The first insulating layer 204 may be disposed on the first and second active fins AF1a, AF1b, AF2a, and AF2b, and the dummy fins DFa through DFd. The first insulating layer 204 may be disposed between the first active fins AF1a and AF1b, and the first gate electrode 210 to be used as a gate insulating film. Also, the first insulating layer 204 may be disposed between the second active fins AF2a and AF2b, and the second gate electrode 215 to be used as a gate insulating film.

The second insulating layer 206 may include an insulating material, and for example, the insulating material may include any one of an oxide film, a nitride film, or an oxynitride film. The second insulating layer 206 may be disposed to have a certain height in a space between the first and second active fins AF1a, AF1b, AF2a, and AF2b, and the dummy fins DFa through DFd. The second insulating layer 206 may be disposed between the first and second active fins AF1a, AF1b, AF2a, and AF2b, and the dummy fins DFa through DFd to be used as a device separating film.

The first gate electrode 210 may be disposed at upper portions of the first and second insulating layers 204 and 206, the first active fins AF1a and AF1b, and the dummy fins DFa and DFb. Accordingly, the first gate electrode 210 may surround the first active fins AF1a and AF1b, the dummy fins DFa and DFb, and the second insulating layer 206. In other words, the first active fins AF1a and AF1b and the dummy fins DFa and DFb are disposed inside the first gate electrode 210. However, other embodiments are not limited thereto, and the first gate electrode 210 may be disposed at upper portions of arbitrary regions of the first active region AR1 and the dummy region DR.

The second gate electrode 215 may be disposed at upper portions of the first and second insulating layers 204 and 206, the second active films AF2a and AF2b, and the dummy fins DFc and DFd. Accordingly, the second gate electrode 215 may surround the second active fins AF2a and AF2b, the dummy fins DFc and DFd, and the second insulating layer 206. In other words, the second active fins AF2a and AF2b and the dummy fins DFc and DFd may be disposed inside the second gate electrode 215. However, other embodiments are not limited thereto, and the second gate electrode 215 may be disposed at upper portions of arbitrary regions of the second active region AR2 and the dummy region DR.

In this embodiment, the first gate electrode 210 may correspond to the second upper conductive line CL2a of FIG. 5, and the second gate electrode 215 may correspond to the second lower conductive line CL2b of FIG. 5. The first and second gate electrodes 210 and 215 may include, for example, a metal material, such as tungsten (W) or tantalum (Ta), a nitride thereof, a silicide thereof, or doped polysilicon, and may be formed by using a deposition process. The first and second gate electrodes 210 and 215 may also be referred to as first and second gate structures.

A first gate contact 220 may be formed on the first gate electrode 210 in the dummy region DR. The first gate contact 220 may correspond to the second upper contact CB2a of FIG. 5. A second gate contact 225 may be formed on the second gate electrode 215 in the dummy region DR. The second gate contact 225 may correspond to the second lower contact CB2b of FIG. 5. The first and second gate contacts 220 and 225 may include an electrically conductive material.

Vias 230 and 235 may be respectively formed on the first and second gate contacts 220 and 225. The vias 230 and 235 may correspond to the first via V_0 of FIG. 5. The vias 230 and 235 may have substantially the similar dimensions as the first and second gate contacts 220 and 225. The vias 230 and 235 may include an electrically conductive material.

A metal layer 240 may be formed on the vias 230 and 235. The metal layer 240 may correspond to the first metal line M1b of FIG. 5. The first and second gate electrodes 210 and 215 may be electrically connected to each other by the metal layer 240, and may receive the same control signal, such as the second control signal B of FIG. 1. For example, the metal layer 240 may be a metal layer including tungsten (W), aluminum (Al), copper (Cu), molybdenum (Mo), titanium (Ti), tantalum (Ta), ruthenium (Ru), or al alloy thereof, or a polysilicon layer.

Figure 8:
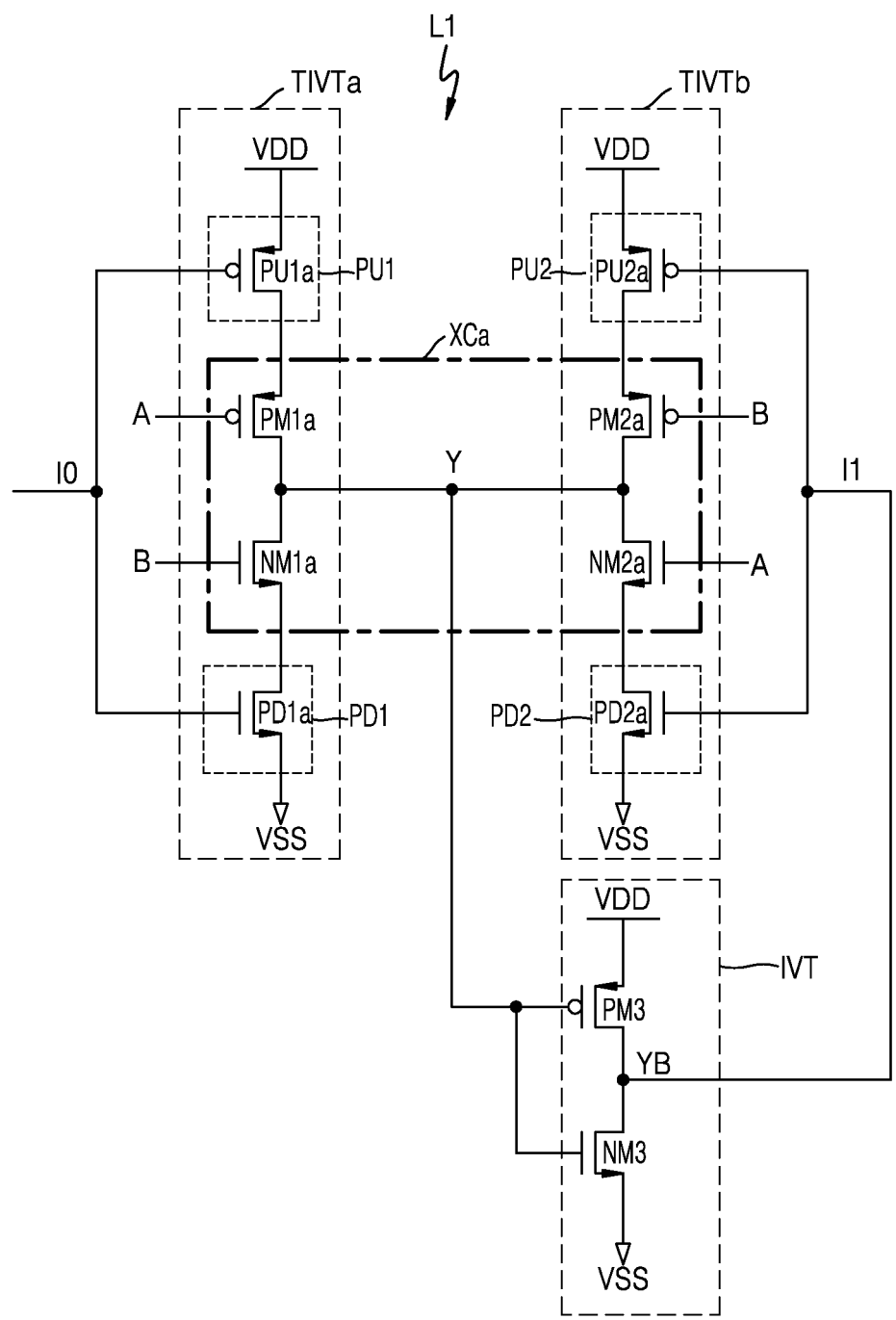
FIG. 8 is a circuit diagram of a latch including a cross-coupled structure, according to an embodiment.

FIG. 8 is a circuit diagram of a latch L1 including a cross-coupled structure, according to an embodiment. Referring to FIG. 8, the latch L1 may include a first tri-state inverter TIVTa, a second tri-state inverter TIVTb, and an inverter IVT. According to this embodiment, the first and second tri-state inverters TIVTa and TIVTb may share the output node Y, may be disposed to face each other, and include a cross-coupled structure XCa. The latch L1 according to this embodiment may be realized as a standard cell. An integrated circuit according to one or more embodiments may include a standard cell in which the latch L1 including the cross-coupled structure XCa is to be realized.

The first tri-state inverter TIVTa may include a first pull-up unit PU1, a first PMOS transistor PM1a, a first NMOS transistor NM1a, and a first pull-down unit PD1. In detail, the first pull-up unit PU1 may include a first pull-up transistor PU1a including a source connected to a power supply terminal VDD and a gate configured to receive a first input signal I0, and the first pull-down unit PD1 may include a first pull-down transistor PD1a including a source connected to a ground terminal GND and a gate configured to receive the first input signal I0.

The first PMOS transistor PM1a may include a source connected to a drain of the first pull-up transistor PU1a, a gate configured to receive the first control signal A, and a drain connected to the output node Y. The first NMOS transistor NM1a may include a drain connected to the first PMOS transistor PM1a and the output node Y, a gate configured to receive the second control signal B, and a source connected to the first pull-down transistor PD1a.

The second tri-state inverter TIVTb may include a second pull-up unit PU2, a second PMOS transistor PM2a, a second NMOS transistor NM2a, and a second pull-down unit PD2. In detail, the second pull-up unit PU2 may include a second pull-up transistor PU2a including a source connected to the power supply terminal VDD and a gate configured to receive a second input signal I1, and the second pull-down unit PD2 may include a second pull-down transistor PD2a including a source connected to the ground terminal GND and a gate configured to receive the second input signal I1.

The second PMOS transistor PM2a may include a source connected to a drain of the second pull-up transistor PU2a, a gate configured to receive the second control signal B, and a drain connected to the output node Y. The second NMOS transistor NM2a may include a drain connected to the second PMOS transistor PM2a and the output node Y, a gate configured to receive the first control signal A, and a source connected to the second pull-down transistor PD2a.

As such, according to this embodiment, the first control signal A may be applied to the gates of the first PMOS transistor PM1a and the second NMOS transistor NM2a, and the second control signal B may be applied to the gates of the first NMOS transistor NM1a and the second PMOS transistor PM2a. Accordingly, the first and second PMOS transistors PM1a and PM2a, and the first and second NMOS transistors NM1a and NM2a may form the cross-coupled structure XCa.

The inverter IVT may include a third PMOS transistor PM3 and a third NMOS transistor NM3. The inverter IVT may be configured to receive a signal of the output node Y, invert the received signal to generate the second input signal I1, and output the second input signal I1 to an inverting output node YB. In detail, the third PMOS transistor PM3 may include a source connected to the power supply terminal VDD, a gate connected to the output node Y, and a drain connected to the inverting output node YB. The third NMOS transistor NM3 may include a drain connected to a drain of the third PMOS transistor PM3 and to the inverting output node YB, a gate connected to the output node Y, and a source connected to the ground terminal GND.

Figure 9:
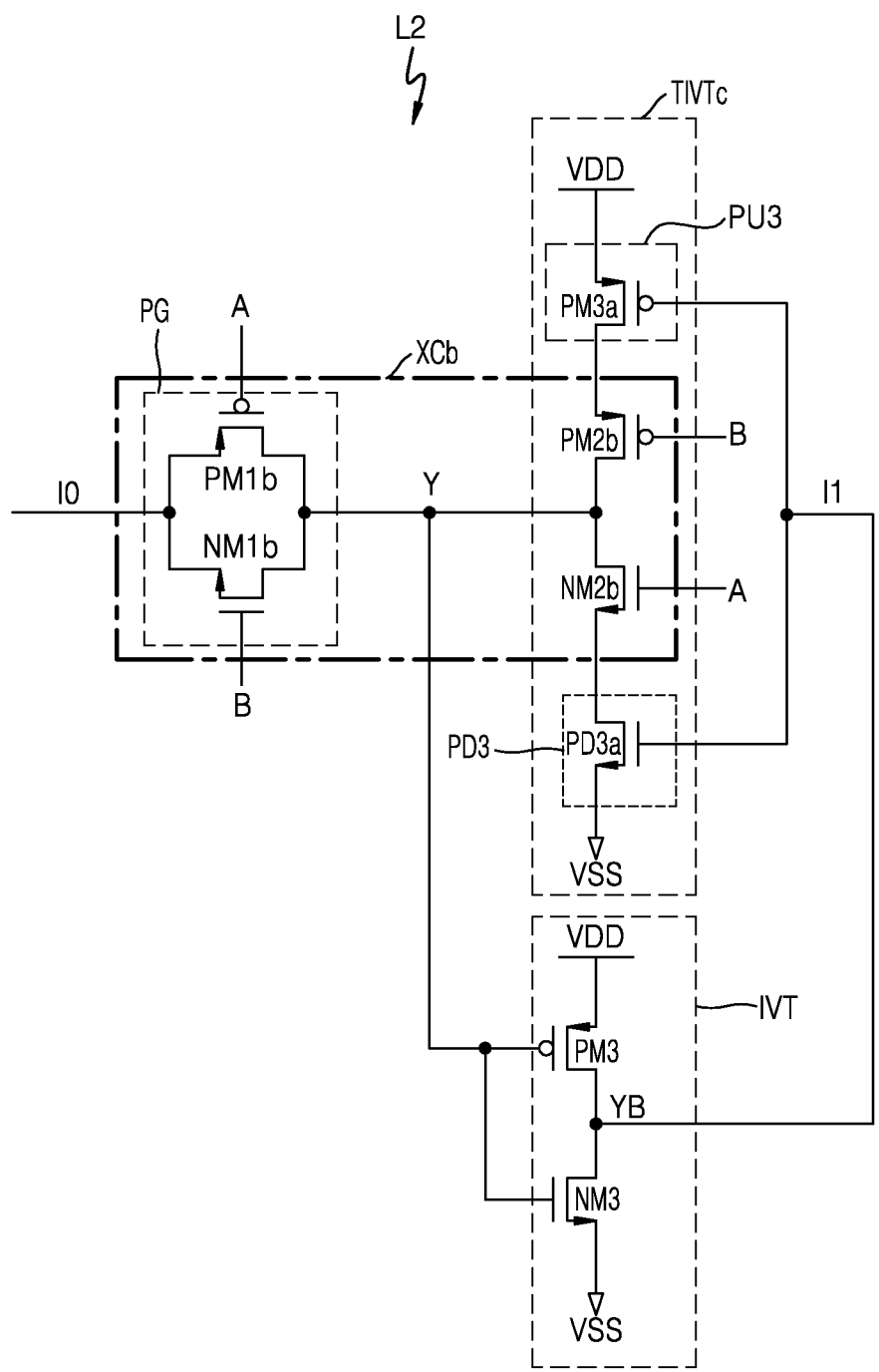
FIG. 9 is a circuit diagram of a latch including a cross-coupled structure, according to an embodiment.

FIG. 9 is a circuit diagram of a latch L2 including a cross-coupled structure, according to an embodiment. Referring to FIG. 9, the latch L2 may include a pass gate PG, a tri-state inverter TIVTc, and the inverter IVT. In this embodiment, the pass gate PG and the tri-state inverter TIVTc may be disposed to share the output node Y, and include a cross-coupled structure XCb. The latch L2 according to this embodiment may be realized as a standard cell. An integrated circuit according to one or more embodiments may include the standard cell in which the latch L2 including the cross-coupled structure XCb is to be realized.

The pass gate PG may include a first PMOS transistor PM1b and a first NMOS transistor NM1b. The pass gate PG may be configured to receive the first input signal I0, and transmit the first input signal I0 to the output node Y according to the first and second control signals A and B. Accordingly, the pass gate PG may also be referred to as a transmission gate.

In detail, the first PMOS transistor PM1b may include a source configured to receive the first input signal I0, a gate configured to receive the first control signal A, and a drain connected to the output node Y. The first NMOS transistor NM1b may include a source configured to receive the first input signal I0, a gate configured to receive the second control signal B, and a drain connected to the output node Y.

The tri-state inverter TIVTc may include a pull-up unit PU3, a second PMOS transistor PM2b, a second NMOS transistor NM2b, and a pull-down unit PD3. In detail, the pull-up unit PU3 may include a pull-up transistor PU3a including a source connected to the power supply terminal VDD and a gate configured to receive the second input signal I1, and the pull-down unit PD3 may include a pull-down transistor PD3a including a source connected to the ground terminal GND and a gate configured to receive the second input signal I1.

The second PMOS transistor PM2b may include a source connected to a drain of the pull-up transistor PU3a, a gate configured to receive the second control signal B, and a drain connected to the output node Y. The second NMOS transistor NM2b may include a drain connected to the second PMOS transistor PM2b and the output node Y, a gate configured to receive the first control signal A, and a source connected to the pull-down transistor PD3a.

As such, according to this embodiment, the first control signal A may be applied to the gates of the first PMOS transistor PM1b and the second NMOS transistor NM2b, and the second control signal B may be applied to the gates of the first NMOS transistor NM1b and the second PMOS transistor PM2b. Accordingly, the first and second PMOS transistors PM1b and PM2b, and the first and second NMOS transistors NM1b and NM2b may form the cross-coupled structure XCb.

The inverter IVT may include the third PMOS transistor PM3 and the third NMOS transistor NM3. The inverter IVT may be configured to receive a signal of the output node Y, invert the received signal to generate the second input signal I1, and output the second input signal I1 to the inverting output node YB. In detail, the third PMOS transistor PM3 may include a source connected to the power supply terminal VDD, a gate connected to the output node Y, and a drain connected to the inverting output node YB. The third NMOS transistor NM3 may include a drain connected to the drain of the third PMOS transistor PM3 and to the inverting output node YB, a gate connected to the output node Y, and a source connected to the ground terminal GND.

Figure 10:
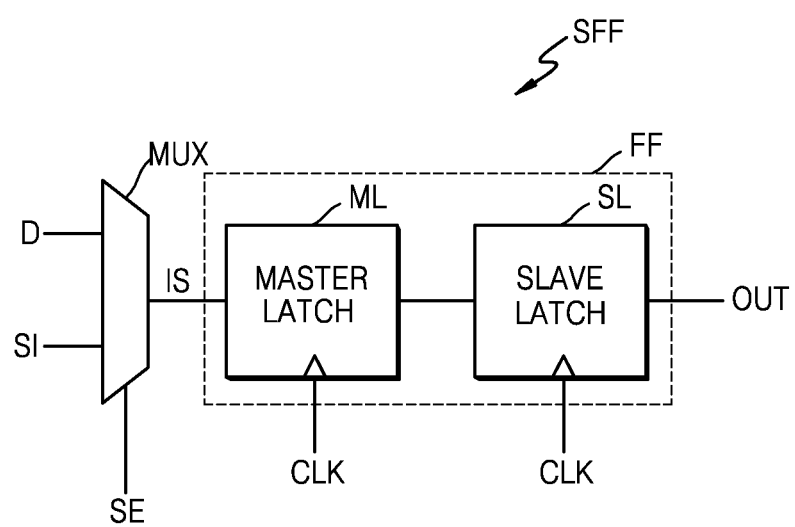
FIG. 10 is a block diagram of a scan flip-flop including a latch, according to an embodiment.

FIG. 10 is a block diagram of a scan flip-flop SFF including a latch, according to an embodiment. Referring to FIG. 10, the scan flip-flop SFF may include a multiplexer MUX and a flip-flop FF. The scan flip-flop SFF may include a cross-coupled structure described above with reference to FIGS. 1 through 9, and in detail, each of the multiplexer MUX and the flip-flop FF may include a cross-coupled structure, for example, the cross-coupled structure XC of FIG. 1. The scan flip-flop SFF according to this embodiment may be realized as a standard cell. An integrated circuit according to one or more embodiments may include a standard cell in which the scan flip-flop SFF including the cross-coupled structure is to be realized.

The multiplexer MUX may be configured to receive a data input signal D and a scan input signal SI, and provide one of the data input signal D and the scan input signal SI as an internal signal IS according to an operation mode. According to this embodiment, the multiplexer MUX may be realized to include a cross-coupled structure, for example, the cross-coupled structure XC of FIG. 1. The multiplexer MUX is configured to select the data input signal D and provides the internal signal IS based on the data input signal D in a first operation mode, and select the scan input signal SI and provides the internal signal IS based on the scan input signal IS in a second operation mode. For example, the first operation mode may be a normal operation mode performing data transmission and the second operation mode may be a scan test mode performing a test operation.

According to an embodiment, the operation mode may be determined according to a logic level of a scan enable signal SE. For example, the operation mode may be the normal operation mode when the scan enable signal SE is a first logic level (for example, a logic low level), and may be the scan test mode when the scan enable signal SE is a second logic level (for example, a logic high level), but other embodiments are not limited thereto.

In the normal operation mode, the multiplexer MUX may be configured to provides the data input signal D as the internal signal IS, and the flip-flop FF may be configured to perform a normal operation of latching the data input signal D. In contrast, in the scan test mode, the multiplexer MUX may be configured to provide the scan input signal SI as the internal signal IS, and the flip-flop FF may be configured to perform a scan operation of latching the scan input signal SI.

The flip-flop FF may be configured to latch the internal signal IS based on a clock signal CLK. According to this embodiment, the flip-flop FF may be a master-slave flip-flop including a master latch ML and a slave latch SL. The master latch ML may be configured to latch the internal signal IS based on the clock signal CLK, and the slave latch SL may latch an output of the master latch ML based on the clock signal CLK to provide an output signal OUT.

According to an embodiment, the master latch ML may be realized to include a cross-coupled structure. For example, the master latch ML may include the latch L1 of FIG. 8. According to an embodiment, the slave latch SL may be realized to include a cross-coupled structure. For example, the slave latch SL may include the latch L2 of FIG. 9. According to an embodiment, both of the master latch ML and the slave latch SL may be realized to include a cross-coupled structure.

Figure 11:
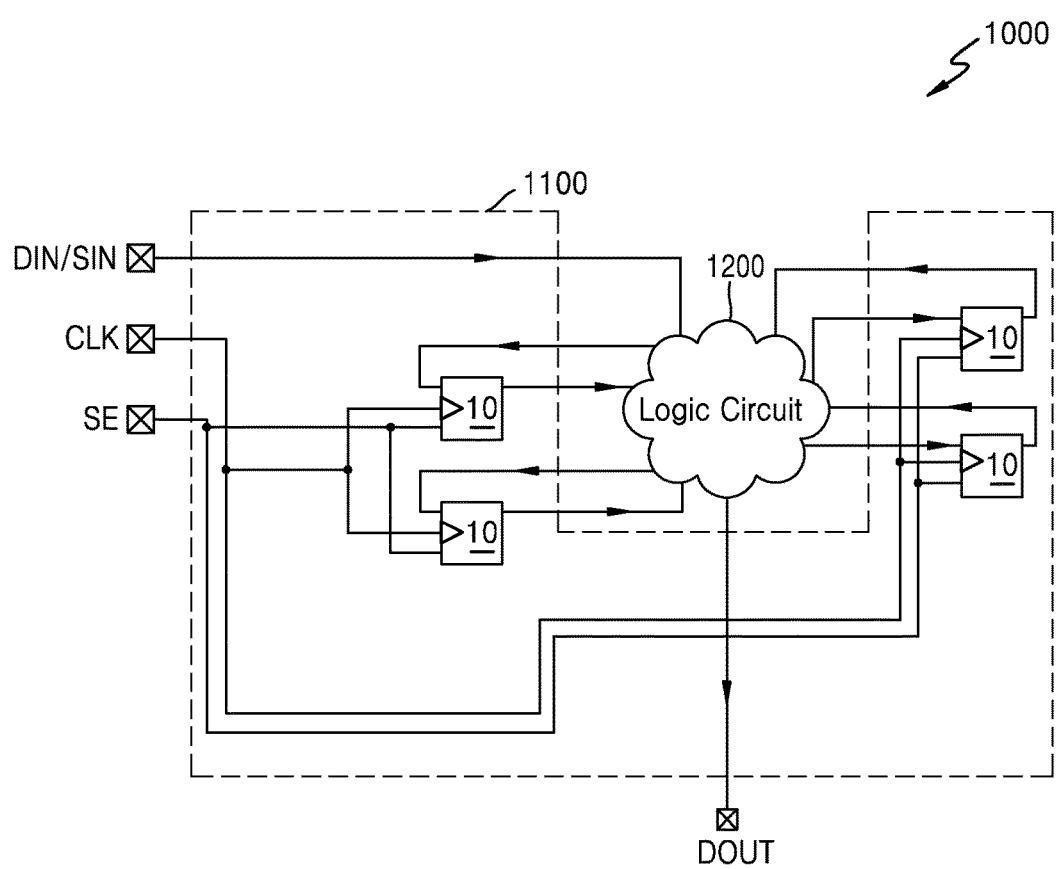
FIG. 11 is a block diagram of a data processing apparatus including a scan flip-flop, according to an embodiment.

FIG. 11 is a block diagram of a data processing apparatus 1000 including a scan flip-flop, according to an embodiment. Referring to FIG. 11, the data processing apparatus 1000 may include a scan flip-flop group 1100 and a logic circuit 1200. The data processing apparatus 1000 may be implemented with an integrated circuit (IC), a system on chip (SoC), a central processing unit (CPU), or a processor.

The scan flip-flop group 1100 may include multiple scan flip-flops 10, wherein each scan flip-flop 10 may be realized as a scan flip-flop of FIG. 10. Each of the scan flip-flops 10 may include a cross-coupled structure according to one or more embodiment, and in detail, may include a 3CPP cross-coupled structure of FIGS. 2 through 5 according to one or more embodiments. Each of the scan flip-flops 10 may be configured to perform data communication with the logic circuit 1200 according to the clock signal CLK. The logic circuit 1200 may be implemented as a synchronous circuit or an asynchronous circuit. The logic circuit 1200 may be configured to process input data DIN or scan data SIN and may supply output data DOUT corresponding to a result of the processing.

Figure 12:
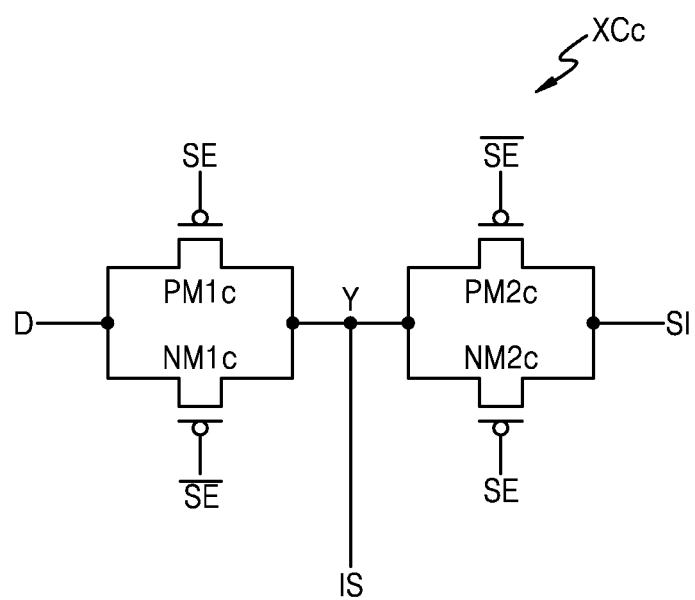
FIG. 12 is a circuit diagram of including a cross-coupled structure, according to an embodiment.

FIG. 12 is a circuit diagram of including a cross-coupled structure, according to an embodiment. In this embodiment, a cross-coupled structure XCc includes a first PMOS transistor PM1c and a first NMOS transistor NM1c, and a second PMOS transistor PM2c and a second NMOS transistor NM2c. In some embodiments, the cross-coupled structure XCc may be used as or part of the multiplexer MUX of FIG. 10. The inputs and output of the multiplexer MUX of FIG. 10 will be used as an example.

The first PMOS transistor PM1c may include a source configured to receive the data input signal D, a gate configured to receive the scan enable signal SE, and a drain connected to the output node Y, to which the internal signal IS is output. The first NMOS transistor NM1b may include a source configured to receive the data input signal D, a gate configured to receive an inverted scan enable signal /SE, and a drain connected to the output node Y. Here the inverted scan enable signal /SE in an inverted version of the scan enable signal SE.

The second PMOS transistor PM2c may include a source configured to receive the scan input signal SI, a gate configured to receive the inverted scan enable signal /SE, and a drain connected to the output node Y. The second NMOS transistor NM2c may include a source configured to receive the scan input signal SI, a gate configured to receive the scan enable signal SE, and a drain connected to the output node Y.

Accordingly, in operation, when the scan enable signal SE is at a first logic level, i.e., at a logic low level, the first PMOS transistor PM1c and the first NMOS transistor NM1c are turned on and the second PMOS transistor PM2c and the second NMOS transistor NM2c are turned off. As a result, the data input signal D passes through to become the internal signal IS. In contrast, when the scan enable signal SE is at a second logic level, i.e., at a logic high level, the first PMOS transistor PM1c and the first NMOS transistor NM1c are turned off and the second PMOS transistor PM2c and the second NMOS transistor NM2c are turned on. As a result, the scan input signal SI passes through to become the internal signal IS.

Some embodiments include an integrated circuit including a standard cell, the standard cell including: first and second active regions having different conductivity types and extending in a first direction; first, second, and third conductive lines extending over the first and second active regions in a second direction substantially perpendicular to the first direction, and disposed parallel to each other; and a cutting layer extending in the first direction between the first and second active regions to separate the first conductive line into a first upper conductive line and a first lower conductive line, the second conductive line into a second upper conductive line and a second lower conductive line, and the third conductive line into a third upper conductive line and a third lower conductive line, wherein the first upper conductive line and the third lower conductive line receive a first control signal, and the second upper conductive line between the first and third upper conductive lines and the second lower conductive line between the first and third lower conductive lines receive a second control signal.

Some embodiments include a semiconductor device including: a substrate including first and second active regions that have different conductivity types and extend in a first direction; first, second, and third upper gate electrodes extending in a second direction substantially perpendicular to the first direction and disposed parallel to each other, on the first active region; and first, second, and third lower gate electrodes respectively disposed on extending lines of the first, second, and third upper gate electrodes, and respectively insulated from the first, second, and third upper gate electrodes, on the second active region, wherein the first upper gate electrode and the third lower gate electrode receive a first control signal, and the second upper gate electrode between the first and third upper gate electrodes and the second lower gate electrode between the first and third lower gate electrodes receive a second control signal.

Figure 13:
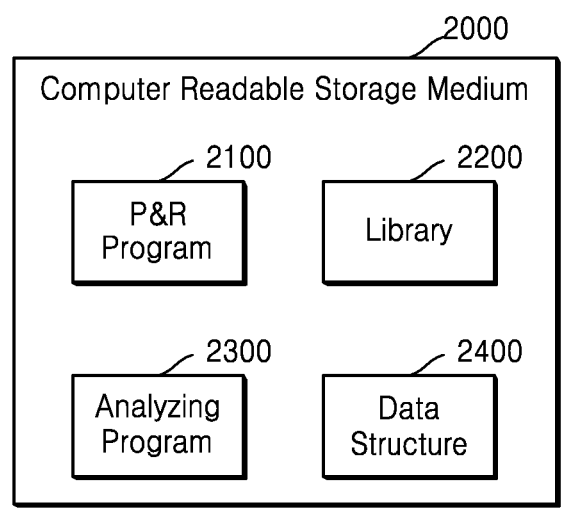
FIG. 13 is a block diagram of a storage medium according to an embodiment.

FIG. 13 is a block diagram of a storage medium 2000 according to an embodiment.

Referring to FIG. 13, the storage medium 2000 is a computer-readable storage medium, and may include an arbitrary storage medium that may be read by a computer while being used to provide commands and/or data to the computer. For example, the storage medium 2000 may include non-transient storage media such as a magnetic or optical medium, such as a disk, a tape, a CD-ROM, a DVD-ROM, a CD-R, a CD-RW, a DVD-R, or a DVD-RW, a volatile or nonvolatile memory, such as a RAM, a ROM, or a flash memory, a nonvolatile memory accessible through a universal serial bus (USB) interface, or a microelectromechanical system (MEMS). The storage medium 2000 may be insertable into a computer, integrated into a computer, or combined with a computer via a communication medium, such as network and/or a wireless link.

As shown in FIG. 13, the storage medium 2000 may include a place and route (P&R) program 2100, a library 2200, an analyzing program 2300, and a data structure 2400. The P&R program 2100 may include multiple commands to cause a computer to perform a method of designing an integrated circuit by using a standard cell library including information about standard cells having a cross-coupled structure according to an embodiment. For example, the storage medium 2000 may store the P&R program 2100 including commands for designing an integrated circuit by using a standard cell library including at least one standard cell described above. The library 2200 may include information about a standard cell that is a unit forming an integrated circuit.

The analyzing program 2300 may include multiple commands for performing a method of analyzing an integrated circuit based on data defining the integrated circuit. The data structure 2400 may include a storage space for managing data generated while using a standard cell library included in the library 2200, extracting certain information from a general standard cell library included in the library 2200, or analyzing, by the analyzing program 2300, characteristics of an integrated circuit.

Figure 14:
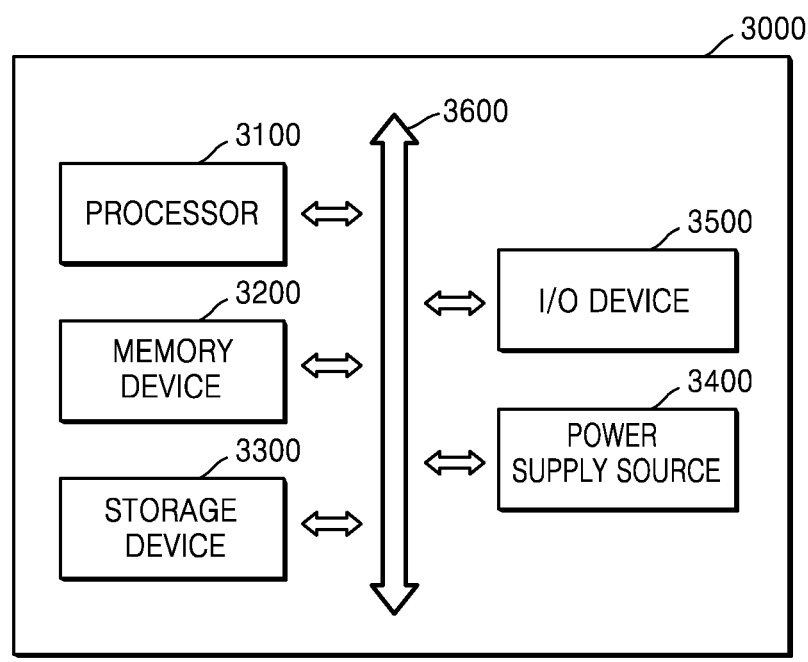
FIG. 14 is a block diagram of a computing system including an integrated circuit, according to an embodiment.

FIG. 14 is a block diagram of a computing system 3000 including an integrated circuit, according to an embodiment. Referring to FIG. 14, the computing system 3000 may include a processor 3100, a memory device 3200, a storage device 3300, a power supply source 3400, and an input/output device 3500. Although not shown in FIG. 14, the computing system 3000 may further include multiple ports that communicate with a video card, a sound card, a memory card, or a USB, or communicate with other electronic devices.

As described above, the processor 3100, the memory device 3200, the storage device 3300, the power supply source 3400, or the I/O device 3500 included in the computing system 3000 may include a scan flip-flop or other circuit according to some embodiments. In an embodiment, at least one of multiple semiconductor devices which are included in the processor 3100, the memory device 3200, the storage device 3300, the power supply source 3400, or the I/O device 3500 may be manufactured according to a layout designed by using a standard cell including a cross-coupled structure according to some embodiments, and in detail, may be manufactured according to a layout designed by using a standard cell including a 3CPP cross-coupled structure of FIGS. 2 through 5 according to embodiments.

The processor 3100 may be configured to perform certain arithmetic operations or tasks. According to some embodiments, the processor 3100 may be a microprocessor or a central processing unit (CPU). The processor 3100 may be configured to communicate with the memory device 3200, the storage device 3300, and the I/O device 3500 through a bus 3600 such as an address bus, a control bus, and a data bus. According to some embodiments, the processor 3100 may be connected to an extension bus such as a peripheral component interconnect (PCI) bus; however in other embodiments, the processor 3100 may be coupled to other types of busses.

The memory device 3200 may be configured to store data necessary for an operation of the computing system 3000. For example, the memory device 3200 may be implemented with dynamic random access memory (DRAM), mobile DRAM, static random access memory (SRAM), phase-change random access memory (PRAM), ferroelectric random access memory (FRAM), resistive random access memory (RRAM), or magnetic random access memory (MRAM). The storage device 3300 may include a solid state drive, a hard disk drive, or a CD-ROM. The I/O device 3500 may include an input unit, such as a keyboard, keypad, or a mouse, and an output unit such as a printer, or a display. The power supply source 3400 may supply an operating voltage necessary for an operation of the computing system 3000.

A cross-coupled structure according to various embodiments, an integrated circuit including a standard cell including a latch having the cross-coupled structure, and a semiconductor device manufactured according to the integrated circuit may each be implemented with various types of packages. For example, some elements of the IC may be mounted by using packages such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flat pack (TQFP), system in package (SIP), multi-chip package (MCP), wafer-level fabricated package (WFP), and/or wafer-level processed stack package (WSP).

While the embodiments have been particularly shown and described with reference to particular embodiments, it will be understood that various changes in form and details may be made therein without departing from the spirit and scope of the following claims.

What is claimed is:

1. A semiconductor device comprising:
   a first gate electrode;
   a second gate electrode, the second gate electrode being spaced apart from the first gate electrode in a first side of a first direction;
   a third gate electrode spaced apart from and aligned with the second gate electrode in a second direction substantially perpendicular to the first direction;
   a fourth gate electrode, the fourth gate electrode being spaced apart from the third gate electrode in a second side of the first direction;
   a first contact on the first gate electrode;
   a second contact on the second gate electrode;
   a third contact on the third gate electrode; and
   a fourth contact on the fourth gate electrode,
   wherein the first contact and the fourth contact are electrically connected,
   wherein the second contact and the third contact are electrically connected, and
   wherein the first side of the first direction and the second side of the first direction are opposite from each other.

2. The semiconductor device of claim 1,
wherein the first contact and the fourth contact are electrically connected by a first metal layer.

3. The semiconductor device of claim 1,
wherein the first gate electrode and the second gate electrode are disposed on a first fin, and the third gate electrode and the fourth gate electrode are disposed on a second fin.

4. The semiconductor device of claim 1,
wherein the semiconductor device further includes a first dummy gate electrode, the first gate electrode and the first dummy gate electrode are aligned in the second direction.

5. The semiconductor device of claim 1,
wherein the semiconductor device further includes a second dummy gate electrode, the fourth gate electrode and the second dummy gate electrode are aligned in the second direction.

6. The semiconductor device of claim 2,
wherein the second contact and the third contact are electrically connected by a second metal layer.

7. The semiconductor device of claim 6,
wherein the first metal layer and the second metal layer are different from each other.

8. A semiconductor device comprising:
a first active region extending in a first direction;
a second active region having different conductivity type from the first active region and extending in the first direction;
a first gate electrode extending in a second direction over the first active region; and
a second gate electrode extending in the second direction over the second active region,
wherein the first gate electrode is spaced apart from and aligned with the second gate electrode in the second direction substantially perpendicular to the first direction, and
wherein the first gate electrode and the second gate electrode are electrically connected.

9. The semiconductor device of claim 8,
wherein the semiconductor device further comprises a first contact on the first gate electrode and a second contact on the second gate electrode, and
wherein the first gate electrode and the second gate electrode are electrically connected by connecting the first contact and the second contact.

10. The semiconductor device of claim 9, wherein the first gate electrode is disposed on a first fin and the second gate electrode is disposed on a second fin.

11. The semiconductor device of claim 9, wherein the first contact and the second contact are electrically connected by a metal layer.

12. The semiconductor device of claim 11, wherein a portion of the metal layer that connects the first contact and the second contact is aligned in the second direction with the first gate electrode.

13. The semiconductor device of claim 9, wherein the first contact and the second contact are not disposed both on the first active region and the second active region.

14. A method of creating a layout of a standard cell, comprising:
creating, by a processor according to a program stored in a memory of a computing system, a first gate electrode extending in a first direction over a first active region and a second active region;
cutting, by the processor according to the program, the first gate electrode to generate an upper first gate electrode and a lower first gate electrode; and
connecting, by the processor according to the program, the upper first gate electrode and the lower first gate electrode,
wherein the second active region is spaced apart from and having different conductivity type from the first active region.

15. The method of claim 14, the method further comprising:
creating, by the processor according to the program, an upper contact on the upper first gate electrode and a lower contact on the lower first gate electrode; and
connecting, by the processor according to the program, the upper contact and the lower contact by a metal layer to connect the upper first gate electrode and the lower first gate electrode.

16. The method of claim 14, wherein the first gate electrode is disposed on a first fin over the first active region and is disposed on a second fin over the second active region.

17. The method of claim 15,
wherein the upper contact and the lower contact are not disposed not both on the first and second active regions.

18. The method of claim 14, the method further comprising:
creating, by the processor according to the program, a second gate electrode in the first direction over the first active region and the second active region;
creating, by the processor according to the program, a third gate electrode in the first direction over the first active region and the second active region;
cutting, by the processor according to the program, the second gate electrodes to generate an upper second gate electrode and a lower second gate electrode; and
cutting, by the processor according to the program, the third gate electrode to generate an upper third gate electrode and a lower third gate electrode,
wherein the first gate electrode, the second gate electrode and the third gate electrode are cut at the same time.

19. The method of claim 18, wherein the second gate electrode is spaced apart from the first gate electrode in a second direction substantially perpendicular to the first direction, and the third gate electrode is spaced apart from the first gate electrode in the second direction.

20. The method of claim 19, the method further comprising:
creating, by the processor according to the program, an upper contact on the upper second gate electrode;
creating, by the processor according to the program, a lower contact on the lower third gate electrode; and
connecting, by the processor according to the program, the upper contact on the upper second gate electrode and the lower contact on the lower third gate electrode.

* * * * *